United States Patent [19]

Ingle et al.

[11] 4,138,509

[45] Feb. 6, 1979

[54] SILICON PURIFICATION PROCESS

[75] Inventors: William M. Ingle; Stephen W. Thompson, both of Phoenix, Ariz.

[73] Assignee: Motorola, Inc., Schaumburg, Ill.

[21] Appl. No.: 864,055

[22] Filed: Dec. 23, 1977

[51] Int. Cl.$^2$ .................... C01B 33/02; C01B 33/08
[52] U.S. Cl. .................................. 427/86; 156/613; 427/248 B; 427/255; 423/111; 423/341; 423/342; 423/349
[58] Field of Search ............... 423/111, 341, 342, 349, 423/350; 427/86, 248 B, 255; 156/613

[56] References Cited

U.S. PATENT DOCUMENTS

| 938,634 | 11/1909 | Betts | 423/111 X |
| 2,840,588 | 6/1958 | Pease | 423/341 X |
| 4,070,444 | 1/1978 | Ingle | 423/349 |

FOREIGN PATENT DOCUMENTS 579643 7/1959 Canada .................................. 423/350

OTHER PUBLICATIONS

Timms, "J. of the Amer. Chem. Soc.," 87:13, 1965, pp. 2824-2828.

Primary Examiner—Jack Cooper
Attorney, Agent, or Firm—John A. Fisher

[57] ABSTRACT

A process for producing semiconductor grade silicon. Metallurgical grade silicon, silicon dioxide, and silicon tetrafluoride are chemically combined at an elevated temperature to form silicon difluoride gas. The silicon difluoride gas is then polymerized, preferably in a two-step process. An initial small quantity of silicon difluoride polymers is formed at a first temperature. This initial polymerization removes most of the impurities that were present in the original metallurgical grade silicon and which were transported by the silicon difluoride gas. The bulk of the remaining silicon difluoride gas is then polymerized at a second, lower temperature. These polymers are substantially free from all impurities. The pure silicon difluoride polymers are then thermally decomposed at temperatures below 400° C. to form binary silicon fluoride homologues. The homologues can be distilled for even higher purity, or can be used or stored as formed. The binary silicon fluoride homologues produce pure silicon and silicon tetrafluoride when heated to a temperature between 400° C. and 950° C. The disproportionation of the homologues can be accomplished by chemical vapor deposition techniques onto heated substrates of silicon, metal, or quartz. This disproportionation will result in amorphous, polycrystalline, or monocrystalline silicon depending on the temperatures employed and on the substrate used for deposition.

5 Claims, 2 Drawing Figures

SILICON PURIFICATION PROCESS

RELATED APPLICATIONS

This invention is related to the process disclosed in co-pending, commonly assigned application Ser. No. 707,153, filed in the name of William M. Ingle, on July 21, 1976, and entitled, "LOW COST, HIGH VOLUME SILICON PURIFICATION PROCESS."

BACKGROUND OF THE INVENTION

This invention relates to a high volume, low cost process for preparing highly purified silicon suitable for use in fabricating silicon solar cells and other semiconductor devices. More particularly, this invention relates to a process for forming distillable binary silicon fluoride homologues which when heated yield semiconductor grade silicon and silicon tetrafluoride.

The electronics industry requires ever increasing amounts of semiconductor grade silicon, where "semiconductor grade silicon" means very high quality silicon of high purity, having negligible amounts of undesirable contaminants. This demand is further growing because of the rising interest in silicon solar cells for the production of electricity. While the high quality is a continuing requirement, the reduction in cost of this high quality silicon is also very important, especially for large area solar cells.

At present, most semiconductor grade silicon is produced by reacting impure metallurgical grade silicon with anhydrous hydrochloric acid to produce trichlorosilane. The trichlorosilane can be purified by distillation, and is then reacted with hydrogen to deposit pure polycrystalline silicon on a heated filament. This process is expensive, partly because it is not a continuous flow, automated process. Many of the steps presently used in this conventional silicon production process are incompatible with continuous process concepts, and thus modification or straightforward automation of the present process is unlikely to result in significant cost savings.

Alternate processes for the production of silicon, and especially for the production of semiconductor grade silicon, have been suggested. In Pease, U.S. Pat. No. 2,840,588, the idea was advanced for reacting silicon and silicon tetrafluoride to form silicon difluoride gas. This gas could be polymerized and then pyrolized to produce silicon. There was no suggestion or teaching in Pease that such a process could result in the large scale production of silicon, nor that the process could be modified to produce distillable binary silicon fluoride homologues.

In the above referenced Ingle application, the disclosure of which is incorporated by reference herein, the ideas of Pease are advanced and a process is disclosed for the continuous production of silicon. In that process the thermal conversion of the silicon difluoride polymer results in the production of appreciable quantities of volatile binary silicon fluorides in addition to silicon. These volatile binary silicon fluorides would distill out in the hot zone of the reaction apparatus and would not be converted into silicon. The resulting oily residues reduce silicon transport yields and hinder silicon removal because of their pyrophoric nature. The process was thus designed to force the reaction towards the production of silicon at the expense of the volatiles, but this lowers the overall efficiency for the production of silicon.

Thus, while there are a variety of ways for preparing semiconductor grade silicon, some well-established and others only developmental, there still remains a need for a high volume process which will produce pure silicon at a low cost.

Accordingly, it is an object of this invention to provide a process for the production of semiconductor grade silicon. The process is continuous, low cost, and can be highly automated.

It is a further object of this invention to provide a process for the production of binary silicon fluoride homologues which can subsequently be disproportionated to yield pure silicon and silicon tetrafluoride.

It is a still further object of this invention to provide a process for the purification of metallurgical grade silicon by heating that impure silicon in the presence of silicon tetrafluoride.

SUMMARY OF THE INVENTION

In accordance with the invention pure semiconductor grade silicon is produced by chemically reacting metallurgical grade silicon, silicon dioxide, and silicon tetrafluoride at an elevated temperature to form silicon difluoride gas. In one embodiment of the invention an initial small quantity of this silicon difluoride gas is polymerized at a first temperature to remove most of the impurities present in the silicon difluoride gas which result from impurities present in the metallurgical grade silicon, the silicon dioxide, or the silicon tetrafluoride reactants. Subsequently, the bulk of the silicon difluoride gas is polymerized at a second, lower temperature. The polymer so formed is substantially free of the impurities which might have been present in the intial reactants. This pure polymer can then be thermally decomposed by controlled heating at temperatures less than 400° C. The results of this decomposition are binary silicon fluoride homologues. These homologues can be used as they are formed, can be stored, or can be distilled for further purification. When heated above 400° C., these binary silicon fluoride homologues are broken up to form pure silicon and silicon tetrafluoride. The disproportionation can be accomplished by a number of convenient methods. For example, the homologues can be brought into contact with a heated filament. Alternatively, the homologues can be used in a chemical vapor deposition technique and the silicon deposited on sheets of metal as thin sheets of large grain polycrystalline silicon. The silicon can also be deposited on sheets of material having a different thermal coefficient of expansion. The difference in the thermal coeffficient of expansion between the material and the silicon would then cause the silicon to lift off upon cooling, resulting in a polycrystalline silicon sheet or ribbon. Still further, the homologues could be used for the epitaxial growth of silicon on monocrystalline silicon substrates.

BRIEF DESCRIPTION OF THE DRAWINGS

Other objects and advantages of the invention will become apparent upon reading the following detailed description and upon reference to the drawings, in which.

While the invention will be described in connection with a preferred procedure, it will be understood that it is not intended to limit the invention to that procedure.

On the contrary, it is intended to cover all alternatives, modifications, and equivalents as may be included within the spirit and scope of the invention as defined by the appended claims.

DETAILED DESCRIPTION

Figure 1:
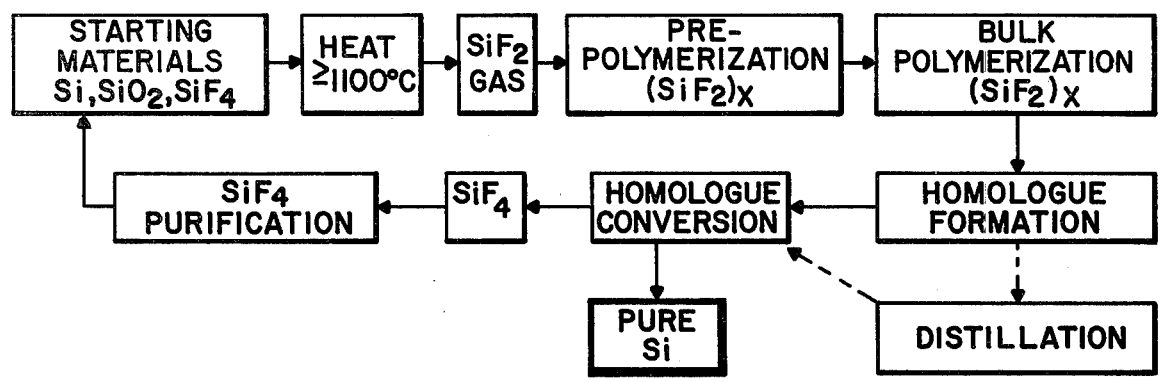
FIG. 1 is a flow chart showing the purification process.

Turning now to the Figures, there is shown in FIG. 1 a flow diagram depicting the important steps in this invention. The starting material for the process is comprised of silicon, silicon dioxide, and silicon tetrafluoride. The silicon can be in form of inexpensive metallurgical grade silicon which has a high impurity content. The silicon dioxide can be conveniently added in the form of a quartz furnace liner, or can be added as broken chunks and scraps of quartz, or can be high purity quartz sand. The silicon dioxide has been demonstrated to be essential in the removal of certain impurities typically found in the metallurgical grade silicon, especially aluminum and boron. The removal of the aluminum impurities, for example, is believed to result from the chemical reactions as shown in the following equations.

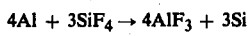

$$4Al + 3SiF_4 \rightarrow 4AlF_3 + 3Si$$

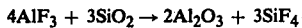

$$4AlF_3 + 3SiO_2 \rightarrow 2Al_2O_3 + 3SiF_4$$

In following the process of the above-referenced Ingle application, when silicon dioxide was not present, the silicon produced was observed to contain aluminum in concentrations not greatly different from that of the starting silicon charge. A convenient and inexpensive source of silicon tetrafluoride is $H_2SiF_6$, a by product of the fertilizer industry. The $H_2SiF_6$ can be reacted with NaF to form $Na_2SiF_6$ which precipitates from solution. After drying, the $Na_2SiF_6$ is heated to about 600° C. to liberate high purity $SiF_4$ with the attendant recovery of the NaF.

The starting materials are heated together to a temperature greater than or equal to 1100° C. This heating forms silicon difluoride gas and represents the first purification step in the process. The purification results because the reaction of silicon with silicon tetrafluoride represents a shift of fluorine atoms from one silicon atom to another and not to bond breaking. The formation of fluorides of the impurities in the metallurgical silicon, however, represents a true bond breaking and does so at the expense of silicon-fluorine bonds. Thermodynamic considerations indicate that only aluminum-fluorine and boron-fluorine bond energies are strong enough to suggest that the silicon tetrafluoride would react directly with aluminum and boron to form the respective fluorides. In the case of aluminum, the reaction occurs so rapidly and so completely that the remaining silicon charge is found to be about 99.99% free of aluminum after being in contact with silicon tetrafluoride for only a few hours at these elevated temperatures. Similar observations have been made for boron, but because of the low initial concentration of boron in metallurgical grade silicon (approximately 50ppm) the effect is obscured by the dramatic effect observed with aluminum.

The process continues with the prepolymerization of a small quantity of the silicon difluoride gas. The prepolymerization is accomplished at a temperature between $-45°$ C. and $+200°$ C. as described in the above-referenced Ingle application. This prepolymerization step serves to remove most of the remaining impurities from the silicon difluoride gas. If this step is carried out in a baffle, particulate contaminates can be removed simultaneously.

The bulk of the silicon difluoride gas is then polymerized. This can be accomplished by further cooling the silicon difluoride gas to a temperature below the initial polymerization temperature, preferably between $-45°$ C. and $-196°$ C.

The silicon difluoride polymer is then controllably heated in a temperature range between 100° C. and 300° C. to form binary silicon fluoride homologues. The heating can be done in vacuum or under an inert atmosphere. It is believed that these homologues are short chain and cyclic species of the general form $Si_nF_{2n+2}$ and $Si_nF_{2n}$, although more generally they can be described to be of the form $Si_xF_y$. By controlling the heating rate and background pressure of silicon tetrafluoride to incorporate some silicon tetrafluoride into the polymer, homologue formation is enhanced. During the conversion, the silicon difluoride polymer is observed to liquify followed by rapid internal thermal rearrangement which yields the homologues. Below 400° C. little if any silicon is formed, and the conversion of the polymer into the liquid and gaseous homologues is essentially 100% complete with no simultaneous silicon formation.

The homologues so formed can now be distilled if further purification is necessary. The homologues are of sufficient stability to be stored for long periods of time, or to be transported to a subsequent reaction site. The as-formed or distilled homologues can then be converted to pure silicon by heating to a temperature between 400° C. and 950° C. The upper temperature should not exceed about 950° C., as above this temperature the resulting silicon and silicon tetrafluoride can react to again form silicon difluoride. Complete conversion of the homologues into silicon and silicon tetrafluoride is obtained by sufficiently long residence times in the hot zone. The silicon obtained can be amorphous, polycrystalline, or monocrystalline, depending upon the conversion temperature and the surface upon which the silicon is deposited. Below 700° C. amorphous silicon is deposited. Above 700° C., polycrystalline or monocrystalline silicon is observed depending upon the crystallinity of the heated substrate. For example, if the heated substrate is a monocrystalline silicon wafer, epitaxial growth occurs and the deposited silicon is monocrystalline. Films of semiconductor grade silicon can be deposited from the homologues onto such materials as silicon, quartz, iron, tungsten plate or wire, nickel, carbon, or molybdenum.

The homologue conversion results in silicon tetrafluoride as one of the reaction products. This silicon tetrafluoride can be recycled and reused as a starting material. Being a volatile gas, the silicon tetrafluoride can be purified before being recycled by distillation or by passing it through a reaction bed to remove unwanted impurities. For example, an iron wire heated to about 850° C. removes traces of oxygen and sulfur contaminants.

The high purity of the silicon produced results from a number of individual purification steps which occur during the process. In heating the starting materials to a temperature in excess of 1100° C. impurities are removed from the metallurgical grade silicon by the action of the silicon tetrafluoride in the presence of silicon dioxide. These impurities are not incorporated in the silicon difluoride gas which is formed. Most of the impurities that are carried by the silicon difluoride gas are removed along with particulate impurities by the prepolymerization step. The homologues formed in the disproportionation of the silicon difluoride polymer can be distilled to further remove any impurities. And finally, a further purification step occurs during the conversion of the homologues into silicon by bringing the homologues into contact with a hot surface. This purification results because the segregation coefficient for metallic impurities in crystalline silicon is much smaller than that in the gas phase.

Figure 2:
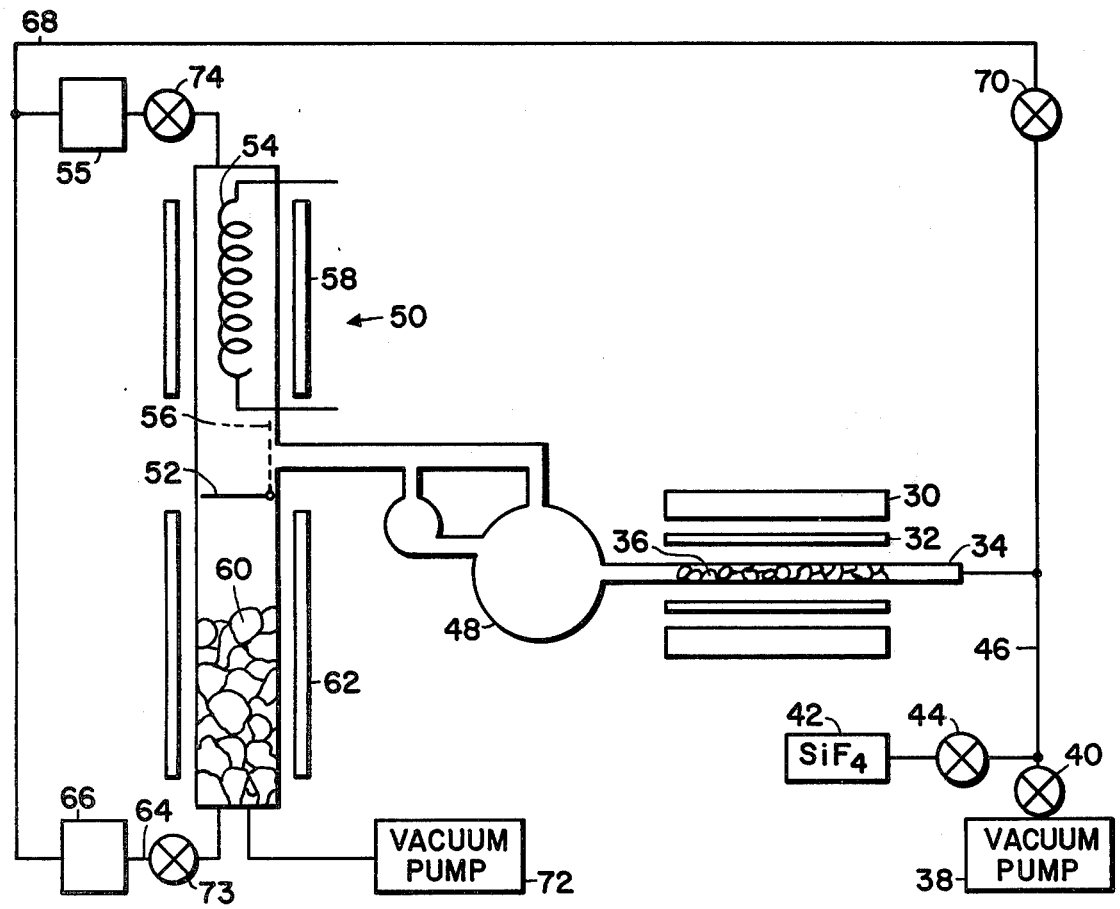
FIG. 2 is a partially schematic diagram showing apparatus suitable for practicing the invention.

FIG. 2 shows an apparatus in schematic form which is suitable for practice of the invention. This apparatus includes a high temperature furance 30 capable of being heated to at least about 1400° C. A process tube 32 which is made of a material capable of withstanding the elevated temperatures used in the process is mounted in the furnace 30. For this purpose a ceramic tube such as one made of mullite with a quartz sleeve 34 on its inside wall has proven to be suitable. A charge 36 of metallurgical grade silicon and silicon dioxide is disposed within that portion of the liner 34 which is within furnace 30. The metallurgical grade silicon and silicon dioxide can be of any convenient size from finely divided powder to large chunks. A vacuum pump 38 controlled by valve 40 allows for out-gassing of the system. The vacuum pump 38 draws off impurities which are released when the charge 36 is heated. After the outgassing is completed, valve 40 is closed. A tank of silicon tetrafluoride 42 controlled by valve 44 then supplies silicon tetrafluoride through tubing 46 to the heated charge 36. As the silicon tetrafluoride flows over and through the charge 36 silicon difluoride gas is formed. The silicon difluoride gas flows out of the furnace 30 to the baffle 48. The baffle 48 can be maintained at a temperature between −45° C. and +200° C. As the silicon difluoride gas flows through the baffle 48, a small amount of the gas is polymerized, removing most of the impurities carried by the gas. Particulate matter carried by the gas is trapped in the baffle. The silicon difluoride gas, now substantially purified, flows out of the baffle 48 and into a conversion unit 50. This flow of gas is controlled by a two-way valve 52. With the valve 52 in the lowered position, as shown, the difluoride gas rises into the upper portion of the conversion unit 50 where it polymerizes on a coil 54. The coil 54 is cooled by a coolant liquid or gas flowing through it to a temperature which is lower than the temperature maintained in the baffle 48. Any silicon difluoride or silicon tetrafluoride which passes through the conversion unit without polymerizing is trapped in a cold trap 55 for later recycling. After the polymerization has proceeded for a time, the valve 52 is moved to the upper position shown by the dotted line 56 to interrupt the flow of silicon difluoride gas from the baffle 48. The upper portion of the conversion unit 50 can then be controllably heated to convert the silicon difluoride polymers which have condensed on the coil 54 to binary silicon fluoride homologues. The controlled heating can be accomplished by regulating the supply of coolant through coil 54 and the amount of heat supplied by a heating element 58. The heating element 58 can be, for example, a heating mantle wrapped around the upper portion of conversion unit 50. The homologues, which can be both liquid and gaseous, fall to the bottom of the conversion unit 50. In the embodiment shown, the lower portion of the conversion unit 50 is loosely filled with chunks or particles of pure silicon 60. The silicon 60 is heated by a heating element 62 which might be, for example, a second heating mantle surrounding the lower portion of conversion unit 50. Heating the silicon 60 to a temperature between 400° C. and 950° C. converts the homologues to pure silicon which deposits on the heated silicon 60 and to silicon tetrafluoride which exits the conversion unit through tube 64. This silicon tetrafluoride then passes through a trap 66 and is recycled by tube 68 and valve 70 as starting material for the process. After the homologues have dropped from the upper portion of the conversion unit 50 to the lower portion, the coil 54 is once again cooled and valve 52 is moved to the lowered position so that the process can continue. In such a manner, the process proceeds continuously with the silicon difluoride gas being polymerized and then converted to homologues in the upper portion of the conversion unit and the homologues subsequently being collected or converted in the bottom portion of the unit. In place of the heated silicon 60, a collection vessel could be used for collecting the homologues for storage or for distillation. Similarly, heated substrates of materials other than silicon could also be used.

The following nonlimiting examples represent the best modes contemplated for practicing the invention and serve to describe the invention further.

EXAMPLE 1

A three-inch diameter reaction tube about three feet in length and connected as shown in FIG. 2 is charged with chunks of metallurgical grade silicon and silicon dioxide ranging in size from small particles of about 30 mesh to chunks about one inch in diameter. The silicon dioxide consists of scrap quartz that has been etched in dilute hydrofluoric acid and comprises about three weight percent of the charge. The tube containing the metallurgical grade silicon and the silicon dioxide is placed in a furnace, heated to about 1000° C., and evacuated until out-gassing and distillation of volatile material, such as arsenic, is complete. The out-gassing and distillation continues until a pressure in the tube of about 1 micron or less is observed indicating completion. The baffle 48 is maintained at room temperature. The upper portion of the conversion unit 50 is cooled to about −120° C. by passing liquid nitrogen through the coil 54 at a rate sufficient to maintain that temperature. The furnace temperature is raised to about 1350° C. Silicon tetrafluoride is passed through the metallurgical grade silicon/silicon dioxide charge at a flow rate of two grams per minute for one hundred twenty minutes. The flow of the silicon tetrafluoride is then stopped and valve 52 is moved to the upper position 56. The conversion unit is evacuated by vacuum pump 72 after closing valves 73 and 74. Heating is now started in the lower portion of the conversion unit 50 and the pure polycrystalline silicon 60 is raised to a temperature of 850° C. The upper portion of the conversion unit 50 is heated by interrupting the flow of liquid nitrogen through coil 54 and by heating the mantle 58. As the polymer is heated between 150° C. and 300° C. liquid and gaseous homologues are formed and fall into the lower portion of the conversion unit 50 where they contact the heated silicon 60 and are converted into silicon and silicon tetrafluoride. At the completion of the homologue conversion, 48.3 grams (74.8% yield) of semiconductor grade silicon is found to have been transported with the simultaneous recovery of 186 grams (77.6%) silicon tetrafluoride. The silicon tetrafluoride is recovered in the liquid nitrogen trap 66. The $Si_xF_y$ homologues (∼10 gms) which pass through the 850° C. hot zone without disproportionation are collected and recycled. After a second pass through the 850° C. hot zone the only products observed are silicon and silicon tetrafluoride.

EXAMPLE 2

A second experiment is run in exactly the same manner as outlined in example 1. At the conclusion of one hundred twenty minutes of reaction time the metallurgical grade silicon of the starting material is analyzed. Analysis shows that the aluminum and boron concentrations in the charge of metallurgical grade silicon have been reduced to 1-2 parts per million. This represents four and two orders of magnitude purification for the aluminum and boron respectively in the residual metallurgical grade silicon. Less than 1% of that silicon charge is transported in the one hundred twenty minute reaction time.

EXAMPLE 3

A third experiment is run under conditions identical to those used in example 1 except that a quartz furnace liner is not used and no silicon dioxide is added to the metallurgical grade silicon charge. The silicon transported and recovered when the homologues are converted to silicon and silicon tetrafluoride is observed to contain large quantities of aluminum (0.1-1%). This experiment shows that the silicon dioxide is necessary as one of the ingredients of the starting material. To more conclusively show the reaction involved, a quartz tube is connected directly to the electron ionization source inlet probe of a mass spectrometer. Approximately 0.2 grams of aluminum trifluoride ($AlF_3$) is placed in a tube which is then heated in vacuo to 1200° C. Mass spectra are recorded at 200° C. intervals. At 600° C. the spectrum of silicon tetrafluoride is first detected, and at 800° C. and 1000° C. the silicon tetrafluoride spectrum is considerably more intense. At no time is the mass spectrum of $AlF_3$ observed. At the end of the experiment, the white residue which coats the inside of the quartz tube is analyzed and the analysis is consistent with the formula $Al_2O_3$. Apparently the $AlF_3$ reacts with the silicon dioxide at elevated temperatures to form silicon tetrafluoride and $Al_2O_3$, vis.,

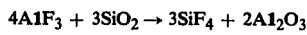

$4AlF_3 + 3SiO_2 \rightarrow 3SiF_4 + 2Al_2O_3$

EXAMPLE 4

The binary silicon fluoride homologues produced in accordance with the invention can be used as silicon sources for the chemical vapor deposition of silicon on a variety of substrates. A distillable mixture of homologues is prepared by passing silicon tetrafluoride through a metallurgical grade silicon/silicon dioxide mixture heated to 1300° C., condensing the silicon difluoride polymer at −196° C., and then slowly heating the polymer in the temperature range between 140° C. and 250° C. in a nitrogen ambient. The homologues so formed are then distilled, leaving no visible residue in a collection vessel. A tungsten filament is connected between two electrodes in a quartz tube and enough power (resistance heating) is supplied to the filament to raise its temperature to 850° C. The homologues are distilled in vacuo on the filament for 60 minutes. The filament is then sectioned and the silicon thickness measured. It is observed that about one hundred microns of silicon is deposited. In a similar experiment using a silicon filament at the same temperature, slightly lower deposition rates are observed.

Placing sheets of metal such as cold rolled steel or sheet tungsten in a heated (350-550° C.) stream of distilling homologues causes a very dense sheet of amorphous silicon to form on the surface at rates similar to those observed with the tungsten wire. When the amorphous silicon is sintered at temperatures above 700° C. large grains of polycrystalline silicon are formed. The surface of the silicon thus formed is flat and mimics the texture of the metallic surface below. After sintering, the polycrystalline silicon remains intact on the sheet surface in the form of a dense, continuous surface sheet about 125 microns in thickness.

When single crystal silicon wafers with (111) and (100) crystal orientation are heated to about 900° C. and etched in situ with dilute anhydrous HCl followed by distillation of the homologues over their hot surfaces, epitaxial silicon growth is readily achieved. The epitaxial layer is "N" type in character and ranges from 0.5 to 10 ohm-centimeter.

EXAMPLE 5

Binary silicon fluoride homologues are prepared from the polymer as described in example 4. They are stored for a period of two weeks in a sealed quartz container and then distilled in vacuo as before. At the end of this distillation, a small portion of the homologues remains as a resinous highly cross-linked mass at the bottom of the pot. The distilled homologues are heated in a quartz vessel under a helium over pressure of about 1 atmosphere at a temperature of 850° C. The silicon obtained is powder-like in nature. A small crystal pulling crucible is charged with about 60 grams of the silicon. Upon heating the silicon gives a clean melt and a dislocation-free, single crystal silicon ingot is pulled. The ingot is sliced and polished and wafers obtained having resistivities in the 0.1-10 ohm-centimeter range.

It should now be apparent that a process capable of achieving the stated objectives of the invention has been provided. In addition to being a novel approach to the production of semiconductor grade silicon, this process utilizes low cost starting materials, allows for high conversion efficiencies, and is continuous. Furthermore, depending on the deposition temperature, the silicon deposited from the homologues can be amorphous or crystalline in a variety of shapes and forms. The silicon is of high enough purity to be utilizable directly in the fabrication of solar cells and other semiconductor devices.

While the invention has been described in conjunction with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

What is claimed is:

1. A process for producing pure silicon which comprises the steps of:
   chemically combining metallurgical grade silicon containing aluminum as an impurity and silicon tetrafluoride in the presence of silicon dioxide at a temperature greater than 1100° C. to form silicon difluoride gas;
   forming an initial small quantity of polymers of said silicon difluoride gas including impurities present in said metallurgical grade silicon and said silicon difluoride gas at a first temperature between −45° C. and +200° C.;

forming an additional quantity of polymers of said silicon difluoride gas at a temperature lower than said first temperature, said additional quantity of polymers being substantially free of impurities present in said metallurgical grade silicon or said silicon difluoride gas;

thermally decomposing said additional quantity of polymers by slowly heating in the range from about +100° C. to about +300° C. to form liquid and gaseous binary silicon fluoride homologues;

heating said binary silicon fluoride homologues to a temperature between 400° C. and 950° C. to yield said pure silicon.

2. The process of claim 1 wherein said step of heating said binary silicon fluoride homologues is accomplished in a substantial vacuum to yield silicon suitable for charging a crystal pulling crucible.

3. The process of claim 1 wherein said step of heating said binary silicon fluoride homologues is accomplised by contacting said homologues with a substrate heated between about 400° C. and 950° C., said substrate selected from the group consisting of silicon, tungsten, quartz, steel, nickel, iron, carbon and molybdenum.

4. The process of claim 1 wherein said temperature lower than said first temperature is between −45° C. and −196° C.

5. The process of claim 1 further comprising the step of distilling said homologues before heating to yield said pure silicon.

* * * * *